United States Patent
Kellar et al.

(10) Patent No.: US 10,068,866 B2
(45) Date of Patent: Sep. 4, 2018

(54) INTEGRATED CIRCUIT PACKAGE HAVING RECTANGULAR ASPECT RATIO

(71) Applicant: Intel Corporation, Santa Clara, CA (US)

(72) Inventors: Scot A Kellar, Bend, OR (US); Darren S Crews, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/280,425

(22) Filed: Sep. 29, 2016

(65) Prior Publication Data

US 2018/0090462 A1    Mar. 29, 2018

(51) Int. Cl.
 *H01L 23/00* (2006.01)
 *H01L 23/31* (2006.01)
 *H01L 21/56* (2006.01)

(52) U.S. Cl.
 CPC ............. *H01L 24/14* (2013.01); *H01L 21/56* (2013.01); *H01L 23/3114* (2013.01); *H01L 24/11* (2013.01); *H01L 2224/1413* (2013.01); *H01L 2924/1815* (2013.01); *H01L 2924/3511* (2013.01)

(58) Field of Classification Search
 CPC ..... H01L 24/14; H01L 23/3114; H01L 21/56; H01L 24/11
 See application file for complete search history.

(56) References Cited

U.S. PATENT DOCUMENTS

| | | | | |
|---|---|---|---|---|
| 5,620,927 | A * | 4/1997 | Lee | H01L 21/4853 228/180.22 |
| 5,757,620 | A * | 5/1998 | Edwards | H01L 23/42 165/185 |
| 5,861,666 | A | 1/1999 | Bellaar | |
| 5,925,934 | A * | 7/1999 | Lim | H01L 21/565 174/527 |
| 6,048,753 | A * | 4/2000 | Farnworth | H01L 23/49827 257/E21.511 |
| 6,078,506 | A * | 6/2000 | Sugahara | H01L 23/16 257/704 |
| 6,150,724 | A * | 11/2000 | Wenzel | H01L 25/0657 257/724 |
| 6,219,910 | B1 * | 4/2001 | Murali | H01L 24/11 228/179.1 |
| 6,316,289 | B1 * | 11/2001 | Chung | H01L 24/11 257/E21.508 |

(Continued)

OTHER PUBLICATIONS

"International Application Serial No. PCT/US2017/046016, International Search Report dated Oct. 31, 2017", 3 pgs.

(Continued)

*Primary Examiner* — Jarrett Stark
(74) *Attorney, Agent, or Firm* — Schwegman Lundberg & Woessner, P.A.

(57) ABSTRACT

An integrated circuit (IC) packaging arrangement for surface mounting of the IC includes a package body that encapsulates one or more IC dies. The package body according to some embodiments has rectangular aspect ratio with a length dimension and a width dimension of different size. The IC packaging according to some embodiments includes leadless surface-mount electrical contacts. According to some embodiments, the leadless surface-mount contacts are situated in clusters at opposite ends of the length dimension of the IC body.

14 Claims, 4 Drawing Sheets

(56) References Cited

U.S. PATENT DOCUMENTS

| | | | | |
|---|---|---|---|---|
| 6,415,977 B1* | 7/2002 | Rumsey | | H01L 23/544 |
| | | | | 235/454 |
| 6,518,997 B1* | 2/2003 | Chow | | H05K 13/08 |
| | | | | 348/126 |
| 9,305,889 B2* | 4/2016 | Powell | | H01L 24/05 |
| 9,349,707 B1* | 5/2016 | Sun | | H01L 25/0652 |
| 9,679,838 B2* | 6/2017 | Crisp | | H01L 23/49838 |
| 9,679,876 B2* | 6/2017 | Crisp | | H01L 25/0657 |
| 9,691,724 B2* | 6/2017 | Iihola | | H01L 24/09 |
| 2002/0000648 A1 | 1/2002 | Leong et al. | | |
| 2003/0060035 A1 | 3/2003 | Kimura et al. | | |
| 2003/0089978 A1* | 5/2003 | Miyamoto | | H01L 23/3114 |
| | | | | 257/723 |
| 2003/0122240 A1* | 7/2003 | Lin | | H01L 25/0657 |
| | | | | 257/686 |
| 2004/0145051 A1* | 7/2004 | Klein | | H01L 21/563 |
| | | | | 257/734 |
| 2004/0188819 A1* | 9/2004 | Farnworth | | H01L 21/561 |
| | | | | 257/686 |
| 2004/0257103 A1* | 12/2004 | Park | | G01R 1/0483 |
| | | | | 324/756.05 |
| 2005/0012199 A1* | 1/2005 | Rosenau | | G02B 6/4201 |
| | | | | 257/696 |
| 2006/0055020 A1 | 3/2006 | Bolken et al. | | |
| 2007/0069378 A1* | 3/2007 | Park | | H05K 3/303 |
| | | | | 257/737 |
| 2007/0281392 A1* | 12/2007 | Yee | | H01L 23/3107 |
| | | | | 438/111 |
| 2008/0150115 A1* | 6/2008 | Watanabe | | H01L 23/3128 |
| | | | | 257/686 |
| 2009/0166891 A1* | 7/2009 | Lee | | H01L 21/561 |
| | | | | 257/782 |
| 2009/0309213 A1* | 12/2009 | Takahashi | | H01L 21/561 |
| | | | | 257/707 |
| 2014/0027904 A1* | 1/2014 | Kusanagi | | H01L 23/293 |
| | | | | 257/737 |
| 2015/0069604 A1 | 3/2015 | Hwang et al. | | |
| 2017/0170105 A1* | 6/2017 | Yao | | H05K 3/34 |

OTHER PUBLICATIONS

"International Application Serial No. PCT/US2017/046016, Written Opinion dated Oct. 31, 2017", 9 pgs.

* cited by examiner

INTEGRATED CIRCUIT PACKAGE HAVING RECTANGULAR ASPECT RATIO

TECHNICAL FIELD

Embodiments described herein generally relate to integrated circuits (ICs) and the manufacture thereof. More particularly, embodiments are directed to IC packaging.

BACKGROUND

Electronic devices are being designed and fabricated with ever-increasing levels of integration and complexity. For instance, system-on-chip (SoC) devices may contain entire computing systems, including digital, analog, mixed-signal, and radio-communications circuitry, all on a single semiconductor substrate. Today's applications for these highly-integrated devices call for high-performance computing, high-capacity data storage, diverse modes of communication, high-resolution graphics processing. At the same time, such advanced functionality is being designed into compact device form factors, such as watches, eyeglasses, implantable medical devices, Internet of Things (IoT) modules to be unobtrusively incorporated into host devices, and countless other end-user applications. Accordingly, IC designers face a number of trade-offs between such factors as functionality, performance, die size, end-product space constraints, manufacturability, reliability, and cost, among a host of other factors.

Reliability of a manufactured end product may be affected by manufacturability of the component parts. For example, in the case of large ICs, the soldered connections of the IC to a printed circuit board (PCB) may be subject to substantial stresses as a result of thermal effects experienced by the parts during assembly. Over time, these stresses may lead to electrical contact failure, which may lead to the failure of the end product, resulting in warranty claims, product recalls and, at worst, safety-related risks when the end product happens to be a mission-critical system or critical component of such a system.

Solutions are needed to address these, and other, considerations in the design of integrated circuits and their packaging.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings.

DETAILED DESCRIPTION

Figure 1:
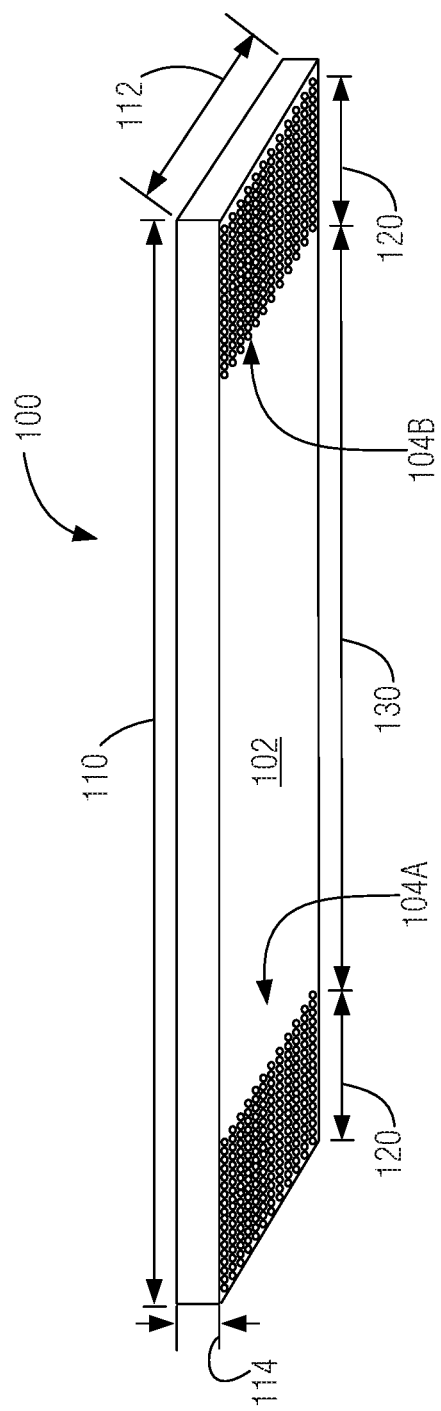
FIG. 1 is a simplified perspective-view diagram illustrating an example packaged IC according to an embodiment.

Aspects of the embodiments are directed to an integrated circuit (IC) packaging arrangement for mounting of the IC on a receiving surface, such as a printed circuit board (PCB), an IC package, or other substrate. The IC packaging has a package body that encapsulates one or more IC dies. The package body according to some embodiments has rectangular aspect ratio with a length dimension and a width dimension of different size. In some embodiments, the length dimension is at least 1.5 times the width dimension, for example. The IC packaging according to some embodiments includes leadless surface-mount electrical contacts. These contacts may be ball-grid array (BGA) contacts, controlled collapse chip connection (C4) contacts (sometimes referred to as flip-chip contacts), or the like.

Leadless contacts provide a rigid connection between the IC packaging body and the printed circuit board (PCB), another IC package, or other substrate to which the IC body is mounted. Unlike gull-wing or any other type of surface-mount leads, leadless contacts provide only negligible compliance when subjected to mechanical forces. Accordingly, leadless contacts are generally subjected to stresses, which they must bear.

According to some embodiments, the leadless surface-mount contacts are situated in clusters at opposite ends of the length dimension of the IC body. The contacts may be on a bottom surface of the IC body, which is to be mounted to a substrate such as a PCB or, in a stacked IC arrangement, to the top of an IC package configured to receive the IC. In some embodiments, the contacts may be arranged on a top surface of the IC package body, which may be the case for an IC intended to have another IC mounted above it in a stacked arrangement.

In a related embodiment, the surface of the IC package body on which clusters of contacts are present at opposite ends of the length dimension is free of other electrical contacts in a middle region between the two clusters.

The contacts at each end along the length dimension may be arranged as a band having a major dimension and a minor dimension, with the major dimension being along the width of the IC package body (perpendicular to the length of the IC package). The minor dimension of the band is along the length of the package body. The major dimension may be at least 1.5 times the minor dimension according to some embodiments.

Advantageously, a PCB assembly or subassembly utilizing a packaged IC according to some embodiments described herein, provides improved manufacturability and reliability. For instance, the rectangular form factor, combined with the spaced-apart clusters of electrical contacts, provides an accommodation for thermally-induced warping.

In particular, during manufacturing, the IC may be subjected to solder-reflow temperatures to form the electrical connections between the leadless electrical contacts and the receiving surface contacts. For example, the elevated processing temperature may be in the vicinity of 220° C. Typically, packaged ICs tend to warp from a generally concave shape (when viewed from above) at room temperature, to a convex shape at the elevated process temperature. Deformation due to warping resulting from differing coefficients of thermal expansion of the IC materials tends to be on the order of 50 microns of displacement in the center of the IC body. Conventional square-shaped ICs generally tend to warp in a spherical form, whereas the rectangular form factor and placement of the electrical contacts according to some embodiments tends to warp in a cylindrical manner.

Moreover, the contact-free span along the length of the IC package between the electrical contacts is unconstrained from deforming due to warping, e.g., without being bound up by electrical contacts along the length of the IC package body. Accordingly, this type of arrangement tends to avoid counteracting push-pull forces at various points of contact between the IC and the surface to which the IC is soldered, which are a cause of stress at certain contacts. Conventionally, the contacts at the corners of a square-shaped IC tend to experience the greatest concentration of stress, and are often found to be the points of failure. According to some of the embodiments described herein, cylindrical warping along the length of the rectangular packaged IC causes the IC package body to deform in the span area without pushing or pulling against any rigid points of contact with the mating surface.

Another advantage of the rectangular form factor of the IC according to some embodiments described herein is its use in size-constrained applications. For example, in a smart glasses product, the long-narrow form factor may facilitate thinner eyeglasses frame designs for housing the IC.

FIG. 1 is a simplified perspective-view diagram illustrating an example packaged IC 100 according to an embodiment. As shown, bottom surface 102 of IC 100 has a first cluster of electrical contacts 104A, and a second cluster of electrical contacts 104B. The electrical contacts may be BGA balls, C4 solder bumps, or other leadless contacts.

Packaged IC 100 has a length dimension 110, a width dimension 112, and a thickness 114. First cluster of contacts 104A and second cluster of contacts 104B are situated at opposite ends along length dimension 110. Notably, the middle region between the clusters 104A, 104B is devoid of any electrical contacts on bottom surface 102. In the embodiment depicted, clusters 104A, 104B are in the form of bands having their major dimension running along width dimension 112, and their minor dimension 120 along the length dimension 110. In various embodiments, minor dimension 120 of the band-shaped clusters of electrical contacts 104A, 104B is a small fraction of the length dimension 110, such as ⅕, ⅒, ⅟₁₅, etc. In a related embodiment, the distance 130 between clusters 104A, 104B is greater than twice the minor dimension 120. Distance 130 represents a middle region that defines the aforementioned span area.

Figure 2:
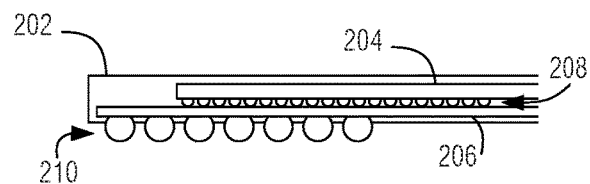
FIG. 2 is a partial cut-away side-view diagram illustrating portions of the interior and the exterior of an IC package according to some embodiments.

FIG. 2 is a partial cut-away side-view diagram illustrating portions of the interior and the exterior of an IC package according to some embodiments. As depicted, IC packaging body 202 encapsulates die 204, on which circuitry, or electromechanical structures (e.g., micro-electromechanical system (MEMS)) are formed. Die 204 is connected to substrate 206 using C4 solder bumps 208, as depicted, wire-bonding (not shown), or other suitable electrical connection. Substrate 206 contains BGA contacts 210, which protrude from the bottom of IC packaging body 202. Notably, BGA contacts 210 are part of a cluster of electrical contacts situated at an end of a length dimension of the packaged IC. Here, BGA contacts 210 are the contacts that interface the IC with a receiving surface of a PCB or other component, assembly, or subassembly to which the IC is to be mounted.

Figure 3:
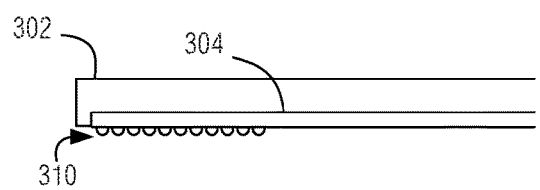
FIG. 3 is a partial cut-away side-view diagram of an IC package according to another embodiment in which "flip-chip" (C4) contacts are used as the contacts that interface the IC with a receiving surface.

FIG. 3 is a partial cut-away side-view diagram of an IC package according to another embodiment in which "flip-chip" (C4) contacts are used as the contacts that interface the IC with the receiving surface. IC packaging body 302 at least partially encapsulates die 304, on which are formed C4 contacts 310, which are exposed beyond the bottom periphery of IC packaging body 302. Here, the C4 contacts 310, as shown, are clustered at the ends of the IC along its length dimension.

Figure 4:
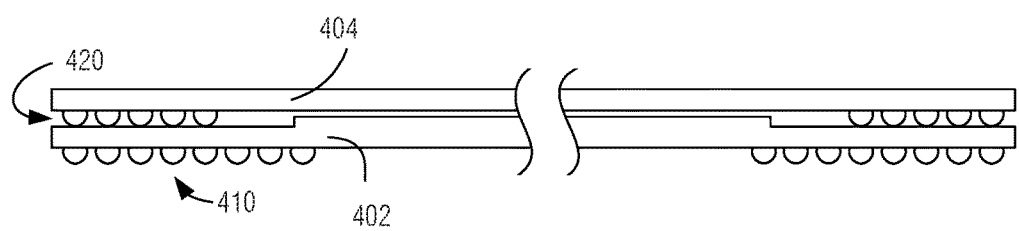
FIG. 4 is a side-view diagram illustrating a stacked-IC example embodiment.

FIG. 4 is a side-view diagram illustrating a stacked-IC example embodiment, with a first IC 402 having end-clustered contacts 410 as the bottom IC of a stack, and a second IC 404, having end-clustered contacts 420 that are electrically bonded to corresponding contacts on a top surface of first IC 402 when the stack is assembled. Any suitable stacking technique may be used. Notably, the contact clusters of first IC 402 and second IC 404 may be of differing size, as depicted.

Figure 5:
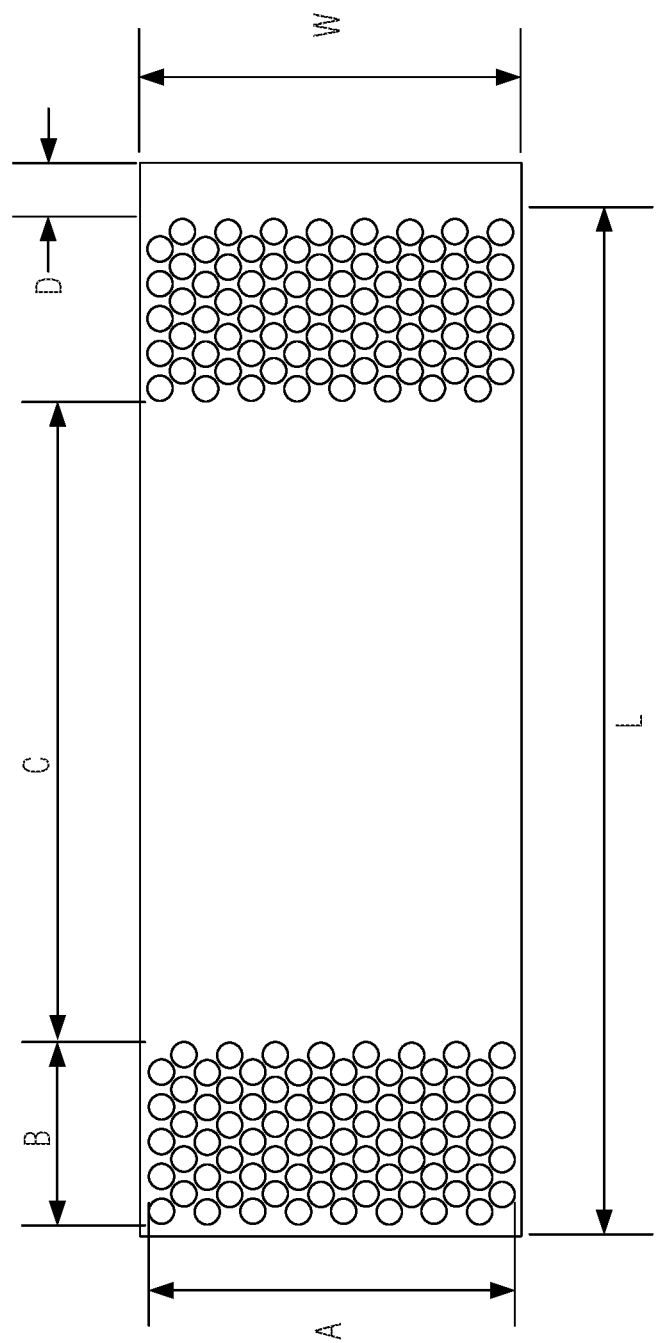
FIG. 5 is a diagram illustrating various dimensions of an IC package according to various embodiments.

FIG. 5 is a diagram illustrating various dimensions of an IC package according to various embodiments. The electrical contacts depicted may be on the bottom surface, or the top surface, of the IC body. Dimensions L and W are the length and width dimensions, respectively, of the IC package. Dimension A is a major dimension of each cluster of leadless electrical contacts, and dimension B is the minor dimension of the cluster. Dimension C represents the contact-free span, or the space between the clusters of electrical contacts. Dimension D represents an overhang of the IC package body beyond the periphery of each cluster of electrical contacts along the length dimension. A variety of ratios of these dimensions are contemplated according to various embodiments. Table 1 below provides some non-limiting ranges for these ratios according to various example embodiments.

TABLE 1

| L/W | A/W | A/B | B/L | C/L | D/L |
|---|---|---|---|---|---|
| 1.5-5.0 | 0.7-0.99 | 1.0-10.0 | 0.05-0.30 | 0.40-0.90 | 0.01-0.30 |

Figure 6A:
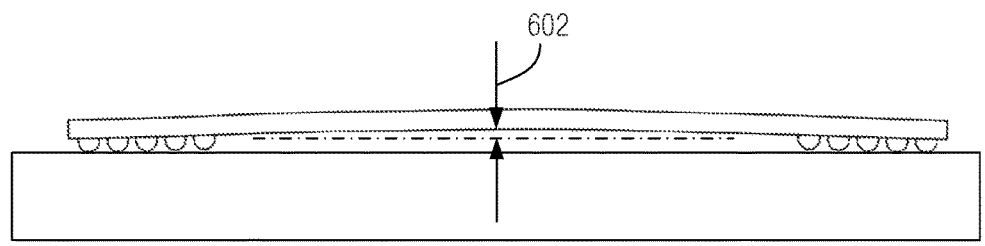
FIGS. 6A and 6B illustrate examples of warpage of an IC under different thermal conditions according to some embodiments.
Figure 6B:
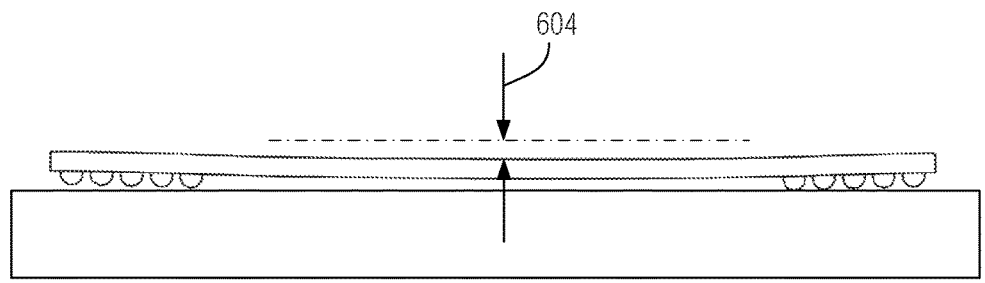

FIGS. 6A and 6B illustrate examples of warpage of an IC under different thermal conditions according to some embodiments. FIG. 6A illustrates convex warpage resulting from deformation 602. FIG. 6B illustrates concave warpage resulting from deformation 604. In some embodiments, warpage is in the concave direction with increasing temperature. Thus, in these examples, the convex deformation 602 may be at room temperature, whereas the concave deformation 604 may be at elevated temperature of a reflow process, e.g., 220° C. Notably, deformation 602 and 604 are very highly exaggerated for illustrative purposes. Typical deformation 602, 604 is in the neighborhood of 50 microns.

In some embodiments, the geometry of the IC packaging described above advantageously results in warpage of a cylindrical shape, as opposed to a spherical shape, as is commonly observed in conventional square-aspect-ratio IC packages. In addition, the freedom of movement of the span portion of the IC between the clusters of electrical contacts reduces the stress that would otherwise be brought to bear on the electrical contacts from the opposing compressive and tensile forces on different electrical contacts along the length dimension. In embodiments where the electrical contacts are clustered in relatively narrow bands (having minor dimension B (FIG. 5) that are spaced apart from one another), the opposing compressive/tensile forces act over the B dimension, which is a fraction of the force seen by a conventional IC with electrical contacts in the middle region as well as at the edges.

Additional Notes & Examples:

Example 1 is a packaged integrated circuit (IC), comprising: an IC die; a package body encapsulating the IC die, the package body defining a top surface and a bottom surface, and having a thickness dimension between the top and the bottom surfaces, a length dimension, and a width dimension, wherein the length dimension is at least 1.5 times greater than the width dimension, and includes a first end and a second end; and a plurality of leadless surface-mount electrical contacts on the bottom surface, including a first cluster of contacts situated proximate the first end and a second cluster of contacts situated proximate the second end, wherein at least a portion of the plurality of leadless surface-mount electrical contacts are electrically coupled to the die.

In Example 2, the subject matter of Example 1 optionally includes wherein the electrical contacts of the first cluster are arranged as a first band having a major dimension along the width dimension of the package body and a minor dimension along the length of the package body.

In Example 3, the subject matter of Example 2 optionally includes wherein the major dimension of the first band is at least twice the length of the minor dimension.

In Example 4, the subject matter of any one or more of Examples 2-3 optionally include wherein the major dimension of the first band is at least 85% of the width dimension.

In Example 5, the subject matter of any one or more of Examples 2-4 optionally include wherein the electrical contacts of the first band are arranged as an array of rows and columns of electrical contacts, wherein the array includes at least three columns in the minor dimension.

In Example 6, the subject matter of any one or more of Examples 1-5 optionally include wherein the package body has no electrical contacts on the bottom surface between the first cluster and the second cluster.

In Example 7, the subject matter of any one or more of Examples 1-6 optionally include a second plurality of leadless surface-mount electrical contacts on the top surface, including a third cluster of contacts situated proximate the first end and a fourth cluster of contacts situated proximate the second end, wherein at least a portion of the second plurality of leadless surface-mount electrical contacts are electrically coupled to the die.

In Example 8, the subject matter of Example 7 optionally includes wherein the package body has no electrical contacts on the top surface between the third cluster and the fourth cluster.

In Example 9, the subject matter of any one or more of Examples 1-8 optionally include wherein the electrical contacts are ball grid array (BGA) contacts.

In Example 10, the subject matter of any one or more of Examples 1-9 optionally include wherein the electrical contacts are controlled collapse chip connection (C4) contacts.

Example 11 is a packaged integrated circuit (IC), comprising: an IC die; a package body encapsulating the IC die, the package body defining a top surface and a bottom surface, and having a thickness dimension between the top and the bottom surfaces, a length dimension, and a width dimension, wherein the length dimension includes a first end and a second end; and a plurality of leadless surface-mount electrical contacts on the bottom surface, including a first cluster of contacts situated proximate the first end and a second cluster of contacts situated proximate the second end, wherein at least a portion of the plurality of leadless surface-mount electrical contacts are electrically coupled to the die, and wherein the electrical contacts of the first cluster are arranged as a first band having a major dimension along the width dimension of the package body and a minor dimension along the length of the package body.

In Example 12, the subject matter of Example 11 optionally includes wherein the major dimension of the first band is at least twice the length of the minor dimension.

In Example 13, the subject matter of any one or more of Examples 11-12 optionally include wherein the major dimension of the first band is at least 85% of the width dimension.

In Example 14, the subject matter of any one or more of Examples 11-13 optionally include wherein the electrical contacts of the first band are arranged as an array of rows and columns of electrical contacts, wherein the array includes at least three columns in the minor dimension.

In Example 15, the subject matter of any one or more of Examples 11-14 optionally include wherein the package body has no electrical contacts on the bottom surface between the first cluster and the second cluster.

In Example 16, the subject matter of any one or more of Examples 11-15 optionally include a second plurality of leadless surface-mount electrical contacts on the top surface, including a third cluster of contacts situated proximate the first end and a fourth cluster of contacts situated proximate the second end, wherein at least a portion of the second plurality of leadless surface-mount electrical contacts are electrically coupled to the die.

In Example 17, the subject matter of Example 16 optionally includes wherein the package body has no electrical contacts on the top surface between the third cluster and the fourth cluster.

In Example 18, the subject matter of any one or more of Examples 11-17 optionally include wherein the electrical contacts are ball grid array (BGA) contacts.

In Example 19, the subject matter of any one or more of Examples 11-18 optionally include wherein the electrical contacts are controlled collapse chip connection (C4) contacts.

Example 20 is a method for packaging an integrated circuit (IC), comprising: encapsulating an IC die with a package body, the package body defining a top surface and a bottom surface, and having a thickness dimension between the top and the bottom surfaces, a length dimension, and a width dimension, wherein the length dimension is at least 1.5 times greater than the width dimension, and includes a first end and a second end; and arranging a plurality of leadless surface-mount electrical contacts on the bottom surface, including a first cluster of contacts situated proximate the first end and a second cluster of contacts situated proximate the second end, wherein at least a portion of the plurality of leadless surface-mount electrical contacts are electrically coupled to the die.

In Example 21, the subject matter of Example 20 optionally includes wherein the electrical contacts of the first cluster are arranged as a first band having a major dimension along the width dimension of the package body and a minor dimension along the length of the package body.

In Example 22, the subject matter of Example 21 optionally includes wherein the major dimension of the first band is at least twice the length of the minor dimension.

In Example 23, the subject matter of any one or more of Examples 21-22 optionally include wherein the major dimension of the first band is at least 85% of the width dimension.

In Example 24, the subject matter of any one or more of Examples 21-23 optionally include wherein the electrical contacts of the first band are arranged as an array of rows and columns of electrical contacts, wherein the array includes at least three columns in the minor dimension.

In Example 25, the subject matter of any one or more of Examples 20-24 optionally include wherein the package body has no electrical contacts on the bottom surface between the first cluster and the second cluster.

In Example 26, the subject matter of any one or more of Examples 20-25 optionally include a second plurality of leadless surface-mount electrical contacts on the top surface, including a third cluster of contacts situated proximate the first end and a fourth cluster of contacts situated proximate the second end, wherein at least a portion of the second plurality of leadless surface-mount electrical contacts are electrically coupled to the die.

In Example 27, the subject matter of Example 26 optionally includes wherein the package body has no electrical contacts on the top surface between the third cluster and the fourth cluster.

In Example 28, the subject matter of any one or more of Examples 20-27 optionally include wherein the electrical contacts are ball grid array (BGA) contacts.

In Example 29, the subject matter of any one or more of Examples 20-28 optionally include wherein the electrical contacts are controlled collapse chip connection (C4) contacts.

Example 30 is a method for packaging an integrated circuit (IC), comprising: encapsulating the IC die with a package body, the package body defining a top surface and a bottom surface, and having a thickness dimension between the top and the bottom surfaces, a length dimension, and a width dimension, wherein the length dimension includes a first end and a second end; and arranging a plurality of leadless surface-mount electrical contacts on the bottom surface, including a first cluster of contacts situated proximate the first end and a second cluster of contacts situated proximate the second end, wherein at least a portion of the plurality of leadless surface-mount electrical contacts are electrically coupled to the die, and wherein the electrical contacts of the first cluster are arranged as a first band having a major dimension along the width dimension of the package body and a minor dimension along the length of the package body.

In Example 31, the subject matter of Example 30 optionally includes wherein the major dimension of the first band is at least twice the length of the minor dimension.

In Example 32, the subject matter of any one or more of Examples 30-31 optionally include wherein the major dimension of the first band is at least 85% of the width dimension.

In Example 33, the subject matter of any one or more of Examples 30-32 optionally include wherein the electrical contacts of the first band are arranged as an array of rows and columns of electrical contacts, wherein the array includes at least three columns in the minor dimension.

In Example 34, the subject matter of any one or more of Examples 30-33 optionally include wherein the package body has no electrical contacts on the bottom surface between the first cluster and the second cluster.

In Example 35, the subject matter of any one or more of Examples 30-34 optionally include a second plurality of leadless surface-mount electrical contacts on the top surface, including a third cluster of contacts situated proximate the first end and a fourth cluster of contacts situated proximate the second end, wherein at least a portion of the second plurality of leadless surface-mount electrical contacts are electrically coupled to the die.

In Example 36, the subject matter of Example 35 optionally includes wherein the package body has no electrical contacts on the top surface between the third cluster and the fourth cluster.

In Example 37, the subject matter of any one or more of Examples 30-36 optionally include wherein the electrical contacts are ball grid array (BGA) contacts.

In Example 38, the subject matter of any one or more of Examples 30-37 optionally include wherein the electrical contacts are controlled collapse chip connection (C4) contacts.

Example 39 is an integrated circuit comprising: packaging means for encapsulating an IC die, the packaging means defining a top surface and a bottom surface, and having a thickness dimension between the top and the bottom surfaces, a length dimension, and a width dimension, wherein the length dimension is at least 1.5 times greater than the width dimension, and includes a first end and a second end; and contact means electrically connecting with the IC die from an exterior of the packaging means, said contact means including a first cluster situated proximate the first end and a second cluster situated proximate the second end.

In Example 40, the subject matter of Example 39 optionally includes wherein the first cluster is arranged as a first band having a major dimension along the width dimension of the package body and a minor dimension along the length of the package body.

In Example 41, the subject matter of Example 40 optionally includes wherein the major dimension of the first band is at least twice the length of the minor dimension.

In Example 42, the subject matter of any one or more of Examples 40-41 optionally include wherein the major dimension of the first band is at least 85% of the width dimension.

In Example 43, the subject matter of any one or more of Examples 40-42 optionally include wherein the first band is arranged as an array of rows and columns of electrical contacts means, wherein the array includes at least three columns in the minor dimension.

In Example 44, the subject matter of any one or more of Examples 39-43 optionally include wherein the packaging means has no contact means on the bottom surface between the first cluster and the second cluster.

Example 45 is an integrated circuit, comprising: packaging means for encapsulating the IC die, the packaging means having a package body defining a top surface and a bottom surface, and having a thickness dimension between the top and the bottom surfaces, a length dimension, and a width dimension, wherein the length dimension includes a first end and a second end; and contact means on the bottom surface, including a first cluster situated proximate the first end and a second cluster situated proximate the second end, wherein at least a portion of the contact means is electrically coupled to the die, and wherein the first cluster is arranged as a first band having a major dimension along the width dimension of the package body and a minor dimension along the length of the package body.

In Example 46, the subject matter of Example 45 optionally includes wherein the major dimension of the first band is at least twice the length of the minor dimension.

In Example 47, the subject matter of any one or more of Examples 45-46 optionally include wherein the major dimension of the first band is at least 85% of the width dimension.

In Example 48, the subject matter of any one or more of Examples 45-47 optionally include wherein the first band is arranged as an array of rows and columns of electrical contacts, wherein the array includes at least three columns in the minor dimension.

In Example 49, the subject matter of any one or more of Examples 45-48 optionally include wherein the package body has no electrical contacts on the bottom surface between the first cluster and the second cluster.

In Example 50, the subject matter of any one or more of Examples 45-49 optionally include a second contact means on the top surface, including a third cluster situated proximate the first end and a fourth cluster situated proximate the second end, wherein at least a portion of the second contact means is electrically coupled to the die.

In Example 51, the subject matter of Example 50 optionally includes wherein the package body has no electrical contacts on the top surface between the third cluster and the fourth cluster.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A packaged integrated circuit (IC) having a rectangular aspect ratio, the IC comprising:
    an IC die;
    a package body encapsulating the IC die, the package body defining a top surface and a bottom surface, and having a thickness dimension between the top and the bottom surfaces, a length dimension, and a width dimension, wherein the length dimension is at least 1.5 times greater than the width dimension, and includes a first end and a second end; and
    a plurality of leadless surface-mount electrical contacts on the bottom surface, including a first cluster of contacts situated proximate the first end and a second cluster of contacts situated proximate the second end, wherein at least a portion of the plurality of leadless surface-mount electrical contacts are electrically coupled to the die;
    wherein the electrical contacts of the first cluster are arranged as a first band having a major dimension along the width dimension of the package body and a minor dimension along the length of the package body, the major dimension of the first band being at least twice the length of the minor dimension; and
    wherein the package body has no electrical contacts on the bottom surface between the first cluster and the second cluster to define a span portion of the IC; and
    wherein the length and width dimensions of the package body and the span portion cause the package body to undergo cylindrical warpage with deformation of the span portion when the IC is subjected to a reflow soldering process.

2. The packaged IC of claim 1, wherein the major dimension of the first band is at least 85% of the width dimension.

3. The packaged IC of claim 1, wherein the electrical contacts of the first band are arranged as an array of rows and columns of electrical contacts, wherein the array includes at least three columns in the minor dimension.

4. The packaged IC of claim 1, further comprising a second plurality of leadless surface-mount electrical contacts on the top surface, including a third cluster of contacts situated proximate the first end and a fourth cluster of contacts situated proximate the second end, wherein at least a portion of the second plurality of leadless surface-mount electrical contacts are electrically coupled to the die.

5. The packaged IC of claim 4, wherein the package body has no electrical contacts on the top surface between the third cluster and the fourth cluster.

6. The packaged IC of claim 1, wherein the electrical contacts are ball grid array (BGA) contacts.

7. The packaged IC of claim 1, wherein the electrical contacts are controlled collapse chip connection (C4) contacts.

8. A packaged integrated circuit (IC), comprising:
    an IC die;
    a package body encapsulating the IC die, the package body defining a top surface and a bottom surface, and having a thickness dimension between the top and the bottom surfaces, a length dimension, and a width dimension, wherein the length dimension includes a first end and a second end; and a plurality of leadless surface-mount electrical contacts on the bottom surface, including a first cluster of contacts situated proximate the first end and a second cluster of contacts situated proximate the second end, wherein at least a portion of the plurality of leadless surface-mount electrical contacts are electrically coupled to the die, and wherein the electrical contacts of the first cluster are arranged as a first band having a major dimension along the width dimension of the package body and a minor dimension along the length of the package body, the major dimension of the first band being at least twice the length of the minor dimension; and wherein the package body has no electrical contacts on the bottom surface between the first cluster and the second cluster.

9. The packaged IC of claim 8, wherein the major dimension of the first band is at least 85% of the width dimension.

10. The packaged IC of claim 8, wherein the electrical contacts of the first band are arranged as an array of rows and columns of electrical contacts, wherein the array includes at least three columns in the minor dimension.

11. The packaged IC of claim 8, further comprising a second plurality of leadless surface-mount electrical contacts on the top surface, including a third cluster of contacts situated proximate the first end and a fourth cluster of contacts situated proximate the second end, wherein at least a portion of the second plurality of leadless surface-mount electrical contacts are electrically coupled to the die.

12. The packaged IC of claim 11, wherein the package body has no electrical contacts on the top surface between the third cluster and the fourth cluster.

13. The packaged IC of claim 8, wherein the electrical contacts are ball grid array (BGA) contacts.

14. The packaged IC of claim 8, wherein the electrical contacts are controlled collapse chip connection (C4) contacts.

* * * * *